United States Patent [19]

Song et al.

[11] Patent Number: 5,600,186
[45] Date of Patent: Feb. 4, 1997

[54] CAPACITOR VOLTAGE DIVIDER CIRCUIT

[75] Inventors: Won-Chul Song; Chang-Jun Oh; Jong-Ryul Lee; Hae-Wook Choi, all of Yusong-ku, Rep. of Korea; Bang-Sup Song, Champaign, Ill.

[73] Assignee: Electronics and Telecommunications Research Institute, Daejeon-shi, Rep. of Korea

[21] Appl. No.: 350,020

[22] Filed: Nov. 29, 1994

[30] Foreign Application Priority Data

Dec. 3, 1993 [KR] Rep. of Korea ................. 93-26315

[51] Int. Cl.⁶ ................................. H01H 47/00
[52] U.S. Cl. ................. 307/125; 307/109; 327/306
[58] Field of Search ........................... 307/109, 110, 307/125, 85, 86, 43, 112, 113, 115, 116; 327/100, 306, 308, 327, 328, 331

[56] References Cited

U.S. PATENT DOCUMENTS 4,578,772  3/1986  Fujii .............................. 364/850
4,839,787  6/1989  Kojima et al. ..................... 363/60

FOREIGN PATENT DOCUMENTS 5848525  3/1993  Japan .

*Primary Examiner*—William M. Shoop, Jr.
*Assistant Examiner*—Jonathan S. Kaplan
*Attorney, Agent, or Firm*—Antonelli, Terry, Stout & Kraus, LLP

[57] ABSTRACT

A capacitor type voltage divider circuit is disclosed. The divider has a plurality of reference voltage signals applied from an external source. A plurality of switching sections are provided for switching the reference voltage signals from the source in response to first and second clock signals. A plurality of dividing sections are provided which are each comprised of two capacitors for dividing the voltage signals from the switching section into a predetermined value. With the dividing circuit, precise levels of reference voltage signals are obtained and power consumption is low without an increase in size or lowering of operational speed.

5 Claims, 11 Drawing Sheets

CAPACITOR VOLTAGE DIVIDER CIRCUIT

BACKGROUND OF THE INVENTION

1. Field of the Invention

The present invention relates to voltage divider circuits, and more particularly to capacitor type voltage divider circuits having a low power-consumption.

2. Description of the Prior Art

FIG. 1 is the circuit diagram of a typical analog-to-digital converter of a flash type. This converter is the circuit for generating reference voltage signals and converting them into digital data, which comprises a reference voltage generator 100, a comparator 101 and an encoder 102.

In FIG. 1, several reference voltage signals $Vr_1$ to $Vrn-1$ are generated by the reference voltage generator 100 and are provided respectively to inverting terminals (−) of a plurality of operational amplifiers in the comparator circuit 101. Then, a voltage Vin from an external input terminal is commonly applied to respective non-inverting terminals (+) of the amplifiers. The comparator circuit 101 compares each of the reference voltage signals with the external voltage, and resultant signals are provided to an encoder 102. As a result, the encoder 102 encodes the resultant signals and then outputs digital data DO to Dn which indicate whether the external voltage is at any level of the reference voltage signals.

In general, when several reference voltage signals are required in an integrated circuit such for an analog-to-digital converter and the like, it is difficult to separately generate and apply these reference voltage signals directly to the integrated circuit. For this reason, a voltage divider with a plurality of resistors has been used with such an integrated circuits, in which the plurality of resistors are serially connected between two reference voltage terminals and several reference voltage signals are supplied from respective connection between two adjacent resistors. This reference voltage divider circuit of a resistor type is shown in FIG. 2.

The divider circuit 100a of FIG. 2 is an example of the reference voltage generator 100 of FIG. 1. As shown in FIG. 2, several resistors R1 to Rn are serially connected between two source voltage terminals. From respective connection between two adjacent resistors, voltages Vr1 to Vrn-1 are applied and used as reference voltages of the comparator 101 of FIG. 1. For example, the reference voltage Vr1 can be given by the following equation:

$$Vr1 = \frac{R1}{R1 + R2 + \ldots + Rn} \times Vr \qquad (1)$$

where, R1 to Rn are resistance values of the serially connected resistors of FIG. 2, respectively, and Vr is a voltage from one of the source voltage terminals.

By this resistor type voltage divider, several reference voltage signals can be obtained from respective connections of the voltage divider 100a, as given in the equation (1).

However, this resistor type voltage divider 100a has a simple structure, but has two problems as described below.

One of the problems is that it is difficult to obtain precise reference voltage signals. This is because a relative error of about 2% exists between adjacent resistors. Thus, in a case when such a resistor type voltage divider is incorporated in a flash type analog-to-digital converter, there arises a problem that it is difficult to obtain resolution of 8 bits and more.

The other of the problems is that current flows continuously in an analog-to-digital converter (hereinafter, referred as to "A/D converter") regardless of using reference voltage signals. This is because the divider has several resistors between two source voltage terminals. As a result, there arises a problem of large power-consumption. If resistors having high resistance are embodied in the voltage divider, the power-consumption can be relatively reduced. However, since such resistors do not satisfy the condition that an internal resistance must to be low, operation speed is seriously reduced in the case when the voltage divider having the resistors is connected to peripheral circuits. Also, in the case when resistors having a high resistance are embodied in an integrated circuit, such an integrated circuit is substantially increased in size.

To overcome the above-described problems, a capacitor type voltage divider circuit as shown in FIG. 3 has been proposed in Japanese Patent Publication No. SHO 58-48525. In this voltage divider, a technique for reducing reference voltage error is disclosed. Reference voltage error is generated due to error of a capacitor itself caused by processing variation.

In FIG. 3, capacitors C1 and C2 have the same capacitance. The capacitor C1 is connected between an output terminal Vout and a first switch S1. The capacitor C2 is connected between the output terminal Vout and a second switch S2. Each selecting terminal of the switches S1 and S2 is connected to one of first and second contact terminals V1 and V2 and switched by a clock signal CLK as shown in FIG. 4. For example, when the clock signal CLK is high level, i.e. during a time period T1, the selecting terminal of the first switch S1 is connected to the first contact terminal V1 and the second switch S2 is connected to the second contact terminal V2. Then, the output signal Vout1 of the voltage divider 100b is obtained by following equation.

$$Vout1 = V2 + \frac{C1}{C1 + C2} \times (V1 - V2) \qquad (2)$$

On the other hand, when the clock signal CLK is low level, i.e. during a time period T2, the first and second switches S1 and S2 are connected to the second and first contact terminals V2 and V1, respectively. Then, the output signal Vout2 of the voltage divider 100b is obtained by following equation:

$$Vout2 = V2 + \frac{C1}{C1 + C2} \times (V2 - V1) \qquad (3)$$

In this equation (3), when it is assumed that there is an error ΔCO between the capacitors C1 and C2, C1=CO+ΔCO, and C2=CO−ΔCO, a voltage difference of 2ΔV from the output terminal Vout exists as a ripple component, as shown in FIG. 4.

The ripple component can be eliminated by a low pass filter connected to the output terminal. However, since an integrator is embodied in each of the operational amplifiers of the comparator 101, the output signal Containing the ripple component is averaged in the respective operational amplifier. In FIG. 4, a one dot dash line indicates an averaged level of the output signal Vout of the voltage divider 100b.

Thus, in the capacitor type voltage divider, an error of the voltage level caused by a capacitance difference between capacitors can be reduced. However, there is a problem that noise caused by the switching operation of the switch can not be eliminated. Since the voltage divider also does not have a function for generated the reference voltage signals, there arises the problem that each level of the reference voltage signals is not constant, i.e is varied.

SUMMARY OF THE INVENTION

It is an object of the present invention to provide a capacitor type voltage divider circuit in which precise levels of reference voltage signals can obtained.

It is a further object of the present invention to provide a capacitor type voltage divider circuit in which power consumption is low without an increase in size or lowering of operational speed.

It is another object of the present invention to provide a capacitor type voltage divider circuit possible which generates constant reference voltage signals.

It is an additional object of the present invention to provide a capacitor type voltage divider circuit in which reference voltage signals generated thereby is not varied in level in accordance with leakage current.

According to the aspect of the present invention, the capacitor type voltage divider circuit comprising a plurality of reference voltage signals applied externally; a plurality of switching means for switching the reference voltage signals in response to first and second clock signals; and dividing means composed of two capacitors, for dividing the voltage signals from the switching means into a predetermined value.

In this voltage divider circuit, the switching means comprises first and second transistors switched in response to the second clock signal; third, fourth and fifth transistors switched in response to the first clock signal; and a plurality of parasitic capacitors connected between a gate and a drain of each of the transistors, and wherein a third reference voltage signal of the reference voltage signals is connected to a source of the first transistor, a first reference voltage signal thereof is connected to a source of the second transistor; and a second reference voltage signal thereof is commonly connected to sources of the third, fourth and fifth transistors.

In this voltage divider circuit, the voltage dividing means comprises the capacitors arranged so that an output voltage Vri thereof is supplied by following equation:

$$Vri = (V_R \times Ci2 + V_{SS} \times Ci1)/(Ci1 + Ci2)$$

where $V_R$ and $V_{SS}$ are the first and third reference voltage signals, respectively, and Ci1 and Ci2 are each capacitance of the two capacitors, respectively.

According to another aspect of the present invention, the capacitor type voltage divider circuit comprises two switching means for switching externally applied voltage signals in response to first and second clock signals; and two dividing means composed of two capacitors, for dividing the voltage signals from the switching means into a predetermined value, wherein the two switching means are arranged in a differential structure.

In this voltage divider circuit, the dividing means comprises the two capacitors arranged so that, if the two capacitors have the same capacitance, output voltage signals Vc1 and Vc2 thereof and a differential output voltage Vc1–Vc2 are supplied by following equations:

$$Vc1 = (Vin \times C1 - V_R \times C2)/(C1 + C2) - \Delta V$$

$$Vc2 \times V_R \times C4 - Vin \times C3)/(C3 + C4) - \Delta V$$

$$VC1 - VC2 = 2(Vin \times C1 - C2)/(C1 + C2)$$

where C1 and C2 are each the capacitance of the two capacitors in one of the switching means, respectively, C3 and C4 are each the capacitance of the two capacitors in the other of the switching means, respectively, $\Delta V$ is a voltage drop caused by parasitic capacitors, and Vin and $V_R$ are an input voltage and a reference voltage of the externally applied voltage signals, respectively.

In this voltage divider circuit, the dividing means has an output voltage Vri obtained from the following equation:

$$Vri = V_M + [Ci1(V_M - V_{SS}) + Ci2(V_M - V_R)]/(Ci1 + Ci2)$$

where $V_R$, $V_M$ and $V_{SS}$ are first, second and third reference voltages of the externally applied voltage signals, and Ci1 and Ci2 are each the capacitance of the two capacitors.

In this voltage divider circuit, the dividing means comprises the two capacitors arranged so that, if the two capacitors have the same capacitance, output voltage signal Vc1 and Vc2 thereof and a differential output voltage Vc1–Vc2 are defined by following equations:

$$Vc1 = (Vin \times C1 - V_R C2)/(C1 + C2) - \Delta V1$$

$$Vc2 = (-Vin \times C3 + V_R \times C4)/(C3 + C4) - \Delta V2$$

$$Vc1 - Vc2 = 2(Vin \times C1 - V_R \times C2)/(C1 + C2) - (\Delta V1 - \Delta V2)$$

where Vin and $V_R$ are an input voltage and a reference voltage, respectively, C1 and C2 are each the capacitance of the two capacitors in one of the switching means, C3 and C4 are each capacitance of the two capacitors in the other of the switching means, and $\Delta V1$ and $\Delta V2$ are each voltage drop amount caused by parasitic capacitors in the two switching means, respectively.

BRIEF DESCRIPTION OF THE DRAWINGS

This invention may be better understood and its object and advantages will become apparent to those skilled in the art by reference to the accompanying drawings as follows.

DESCRIPTION OF THE PREFERRED EMBODIMENT(S)

Figure 1:
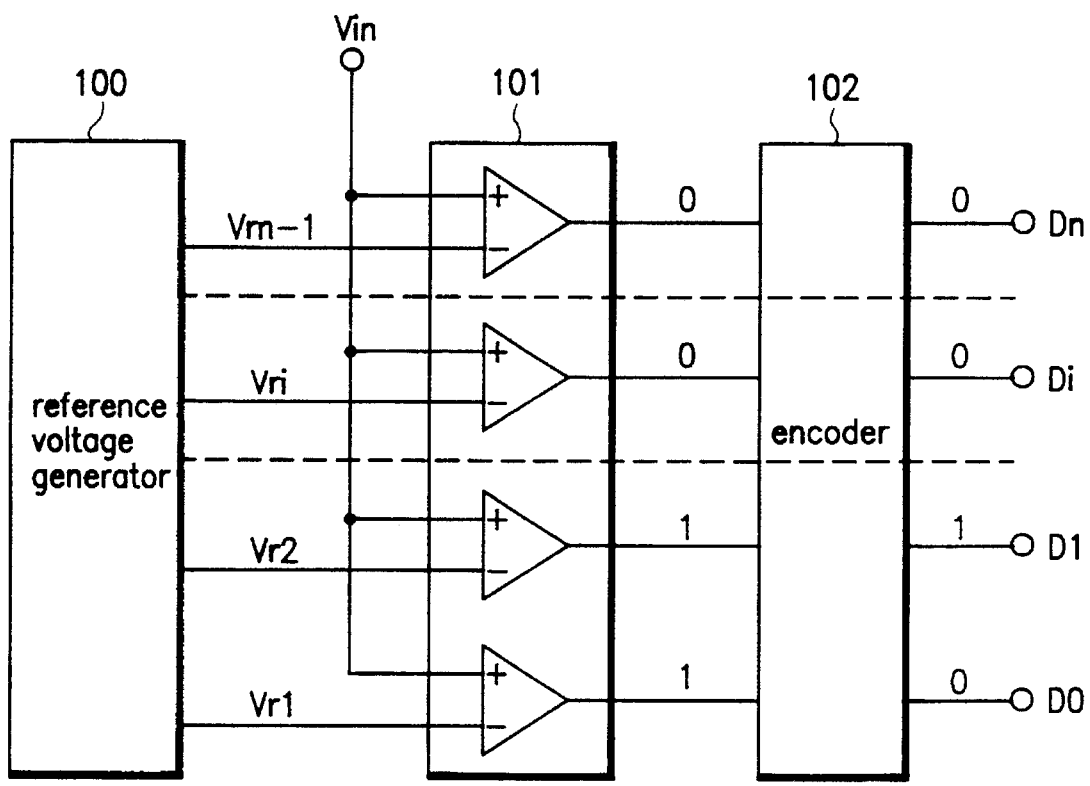
FIG. 1 is a block diagram showing a conventional analog-to-digital converter.
Figure 2:
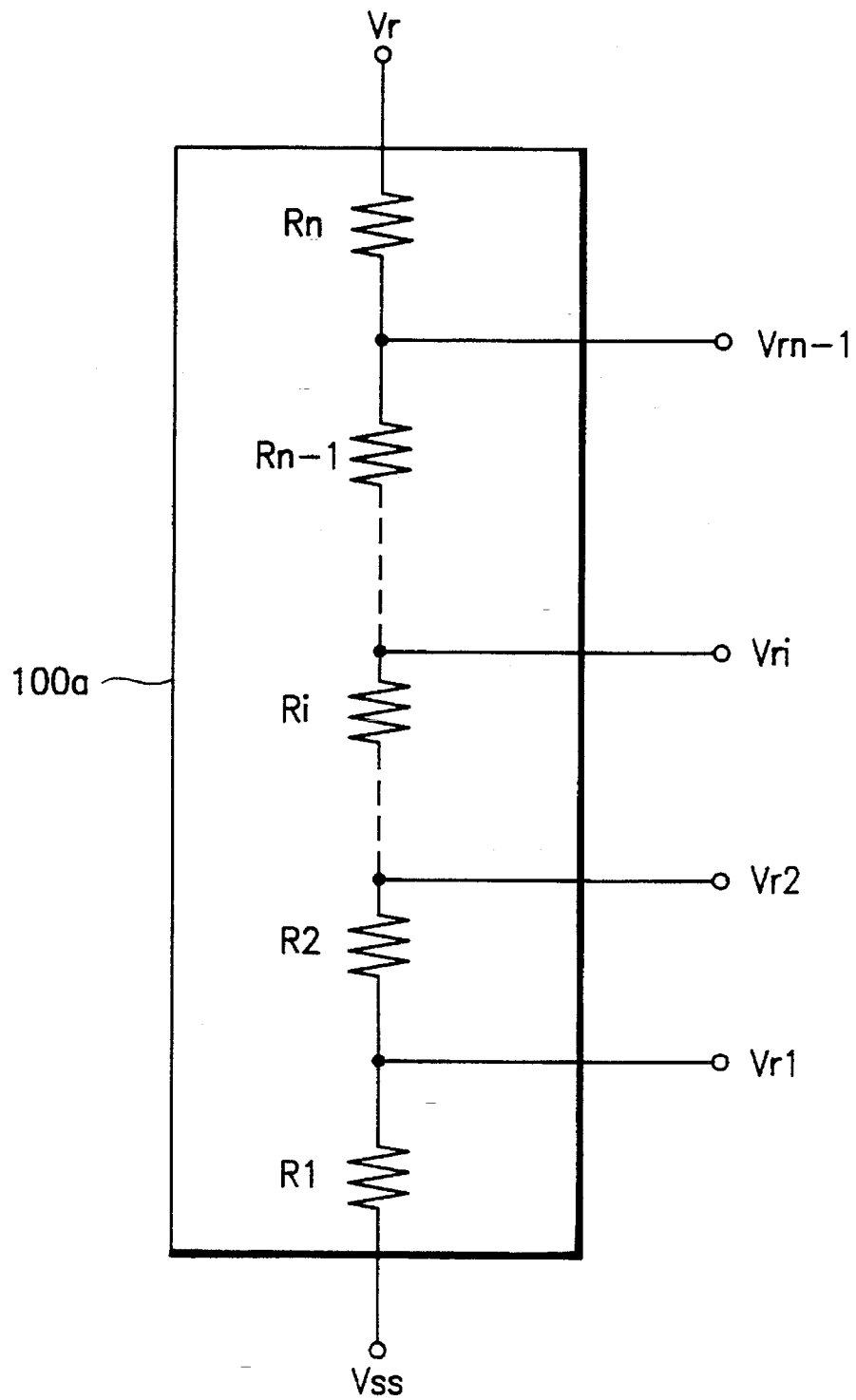
FIG. 2 is a detailed circuit diagram showing a resistor type voltage divider circuit as one example of the voltage divider circuit of FIG. 1.
Figure 3:
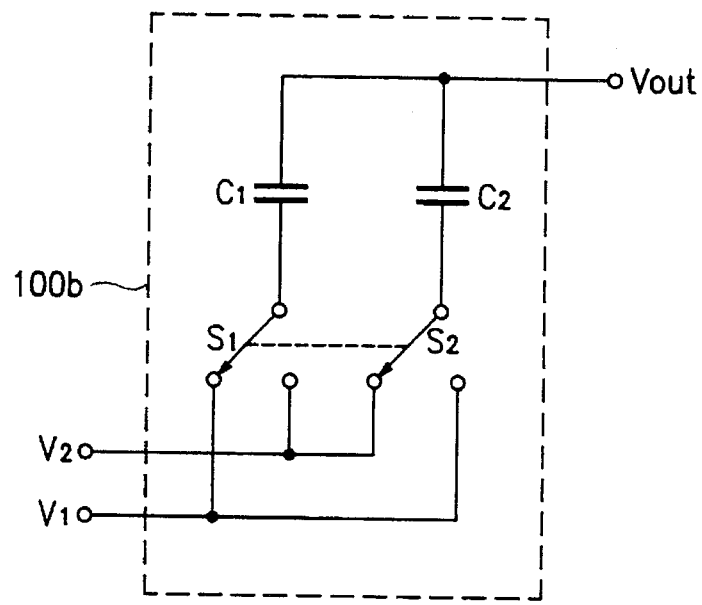
FIG. 3 is a detailed circuit diagram showing a capacitor type voltage divider circuit as another example of the voltage divider circuit of FIG. 1.
Figure 4:
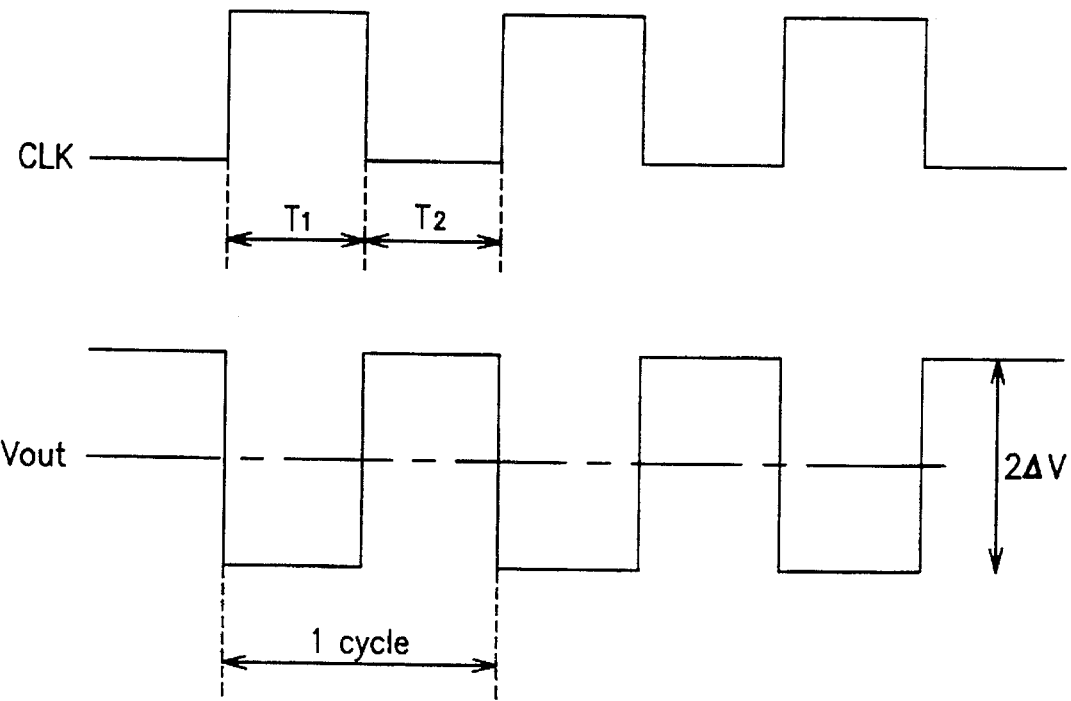
FIG. 4 is a timing diagram of each of the input/output signals in the voltage divider circuit as shown in FIG. 3.
Figure 5:
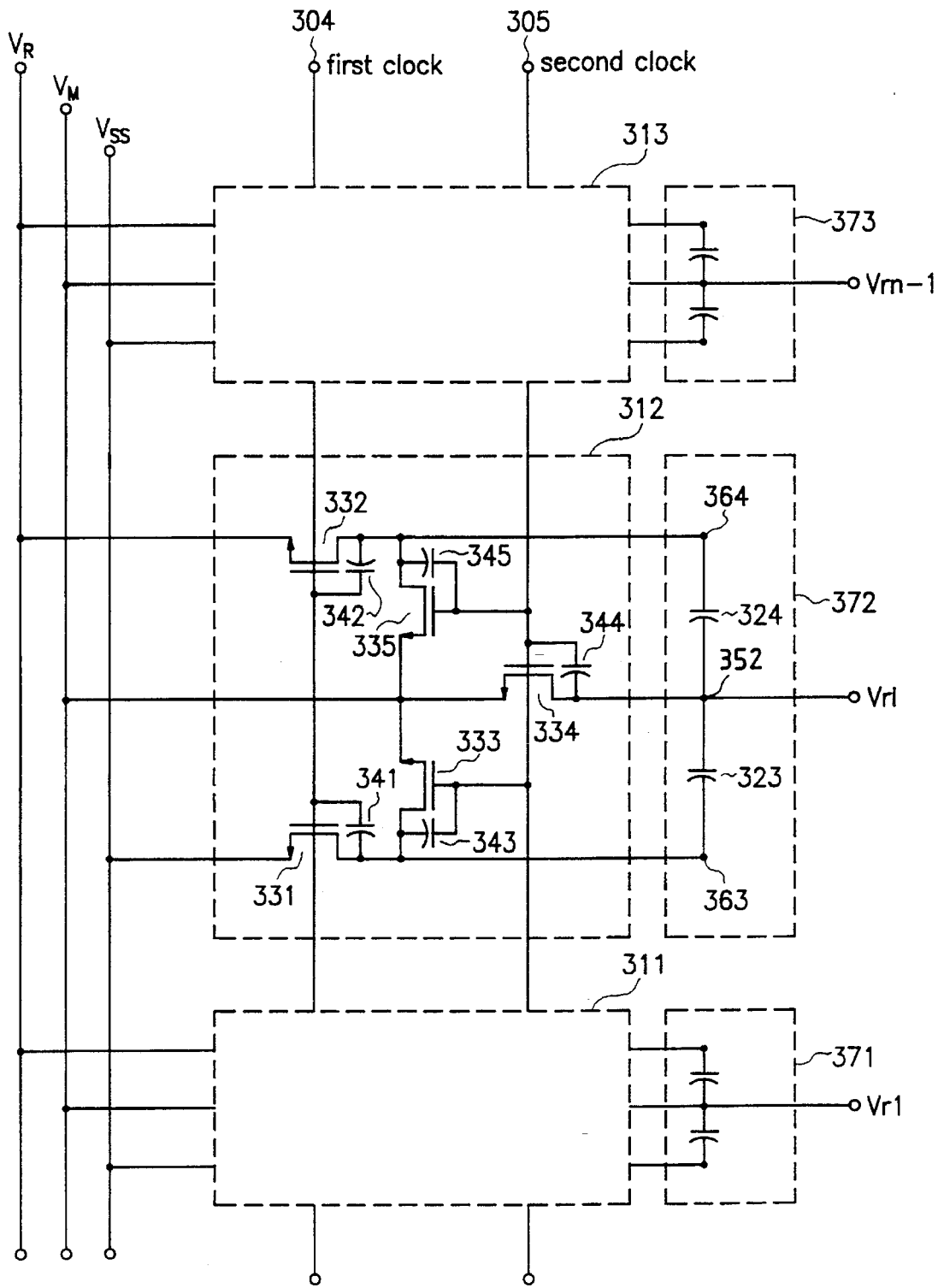
FIG. 5 is a circuit diagram showing the construction of the capacitor type voltage divider circuit according to one embodiment of the present invention.

Referring to FIG. 5, the capacitor type voltage divider circuit according to one embodiment of the present invention comprises three reference voltage sources $V_R$, $V_M$, $V_{SS}$ (hereinafter, referred to as "first, second, third reference voltage sources", respectively) applied from external terminals to switching sections 311, 312, 313 for transmitting the respective reference voltage sources to voltage dividing sections in response to first and second clock signals from clock terminals 304 and 305, and the voltage dividing sections 371, 372, 373 for dividing the reference voltage sources into a predetermined voltage value. Each of the dividing portions 371 to 373 is composed of serially connected capacitors 323 and 324 between two nodes 363, 364. As shown in FIG. 5, each of the switching portions 311 to 313 have the same circuit construction, and detailed circuit layouts of the switching portions other than the switching portion 312 are omitted in FIG. 5. Also, each of the dividing sections 371 to 373 have the same construction and detailed circuit layouts of the voltage dividing portions other than the dividing portion 372 have been are omitted in FIG. 5.

As shown in FIG. 5, the switching portion 312 has five transistors and four capacitors. A source of a first transistor 331 is connected to the third reference voltage source $V_{SS}$, the gate thereof is connected to a first clock terminal 304, and the drain thereof is connected to a first node 363. The source of a second transistor 332 is connected to the first reference voltage source $V_R$, the gate thereof is connected to the first clock terminal 304, and the drain thereof is connected to a second node 364. The source of the third transistor 333 is connected to the second reference voltage source $V_M$, the gate thereof is connected to the second clock terminal 305, and the drain thereof is connected to the first node 363. A source of a fourth transistor 334 is connected to the second reference voltage source $V_M$, the gate thereof is connected to the second clock terminal 305, and the drain thereof is connected to an output node 352 between the capacitors 323 and 324. Also, the source of a fifth transistor 335 is connected to the second reference voltage source $V_M$, the gate thereof is connected to the second clock terminal 305, and the drain thereof is connected to the second node 364.

In addition, between the gate and drain of each transistor, are connected parasitic capacitors 341 to 345 respectively. The dividing section 372 bas the capacitors 323 and 324 connected in series between the first and second nodes 363 and 364.

Hereinafter, operation of the voltage divider circuit as shown in FIG. 5 will be described with reference to the waveform diagram of FIG. 6. In this embodiment, it is assumed that the reference voltage signals are set to satisfy the condition of $V_R > V_M > V_{SS}$ in voltage level.

Figure 6:
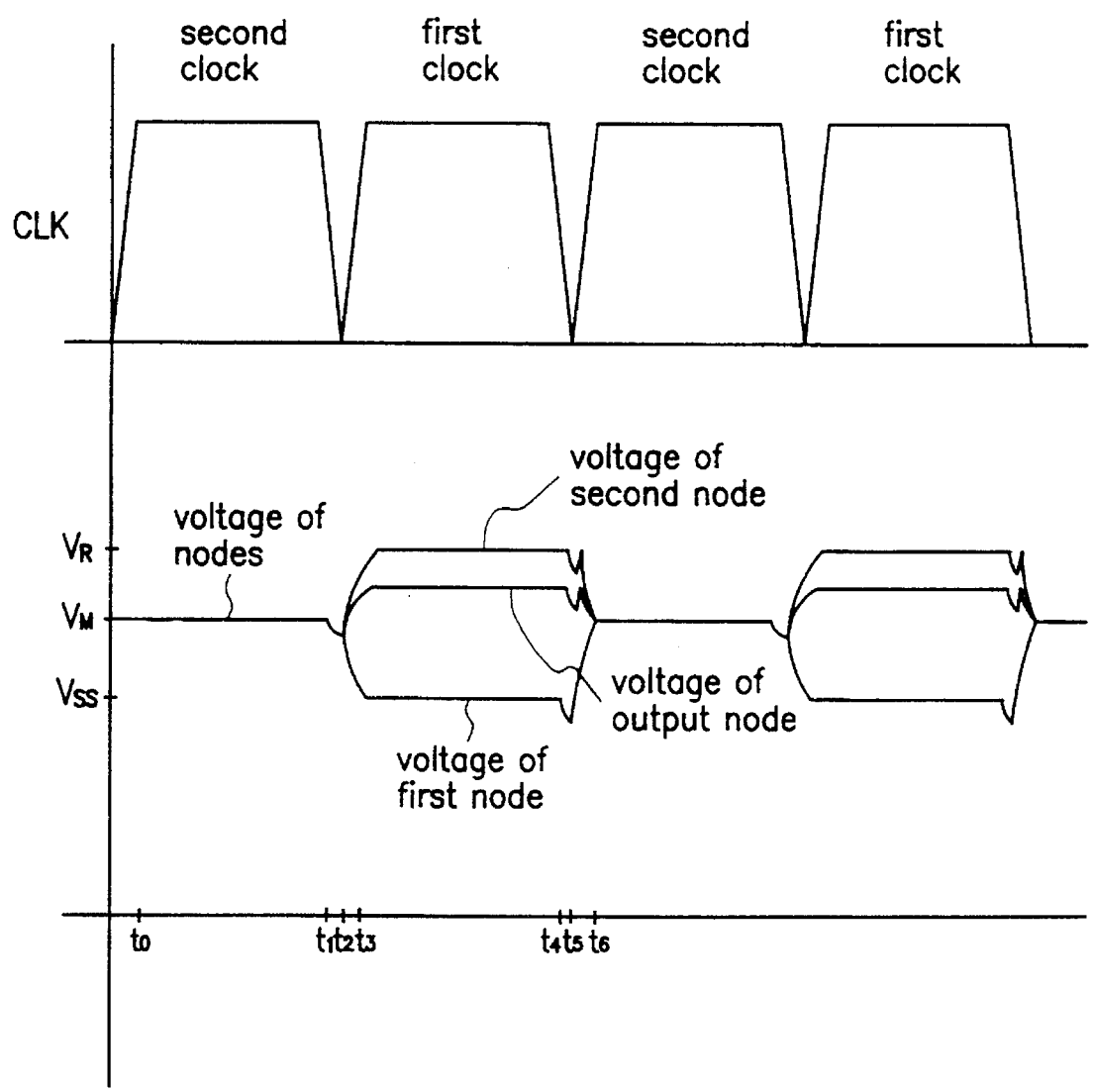
FIG. 6 is a timing diagram showing operation of the voltage divider circuit of FIG. 5.

As shown in FIG. 6, when a clock signal from the second clock terminal 305 is at a high level, i.e. during a time period of t0–t1, all the transistors 333 to 335 are conductive. Then, each voltage of the nodes 352, 363, 364 is equal to the second reference voltage $V_M$ and the first and second capacitors 323 and 324 are discharged.

When the clock signal becomes low level, i.e. during a time period of t1–t2, the transistors 333 to 335 are not conductive and the voltage of each of the nodes 352, 363, 364 is lowered by the parasitic capacitors 343 to 345, which are connected between the drain and gate of the transistors 333 to 335, respectively. However, each of the nodes 352, 363, 364 has the same voltage.

During a time period of t2–t4, since the first clock signal becomes the high level, all the first and second transistors 331, 332 are conductive. Then, the second node 364 is equal to the first reference voltage $V_R$ and the first node 363 is equal to the third reference voltage $V_{SS}$. Then, the voltage Vri of the output node 352 can be expressed following equation:

$$Vri = V_R \times Ci2/(Ci1 + Ci2) + V_{SS} \times Ci1/(Ci1 + Ci2) \qquad (4)$$
$$= (V_R \times Ci2 + V_{SS} + Ci1)/(Ci1 + Ci2)$$

where Ci1 and Ci2 are each the capacitance of the capacitors 323 and 324.

As seen in the above equation (4), if each capacitance of the first and second capacitors 323 and 324 is adjusted to a predetermined value, a desired value between the reference voltages $V_R$ and $V_{SS}$ can be obtained as the output voltage Vri.

Accordingly, the voltage divider circuit according to this embodiment can divide a reference voltage by using a plurality of capacitors. In this embodiment, the second reference voltage $V_M$ is provided to prevent the output voltage Vri from floating, when the first clock signal is low level.

Figure 7:
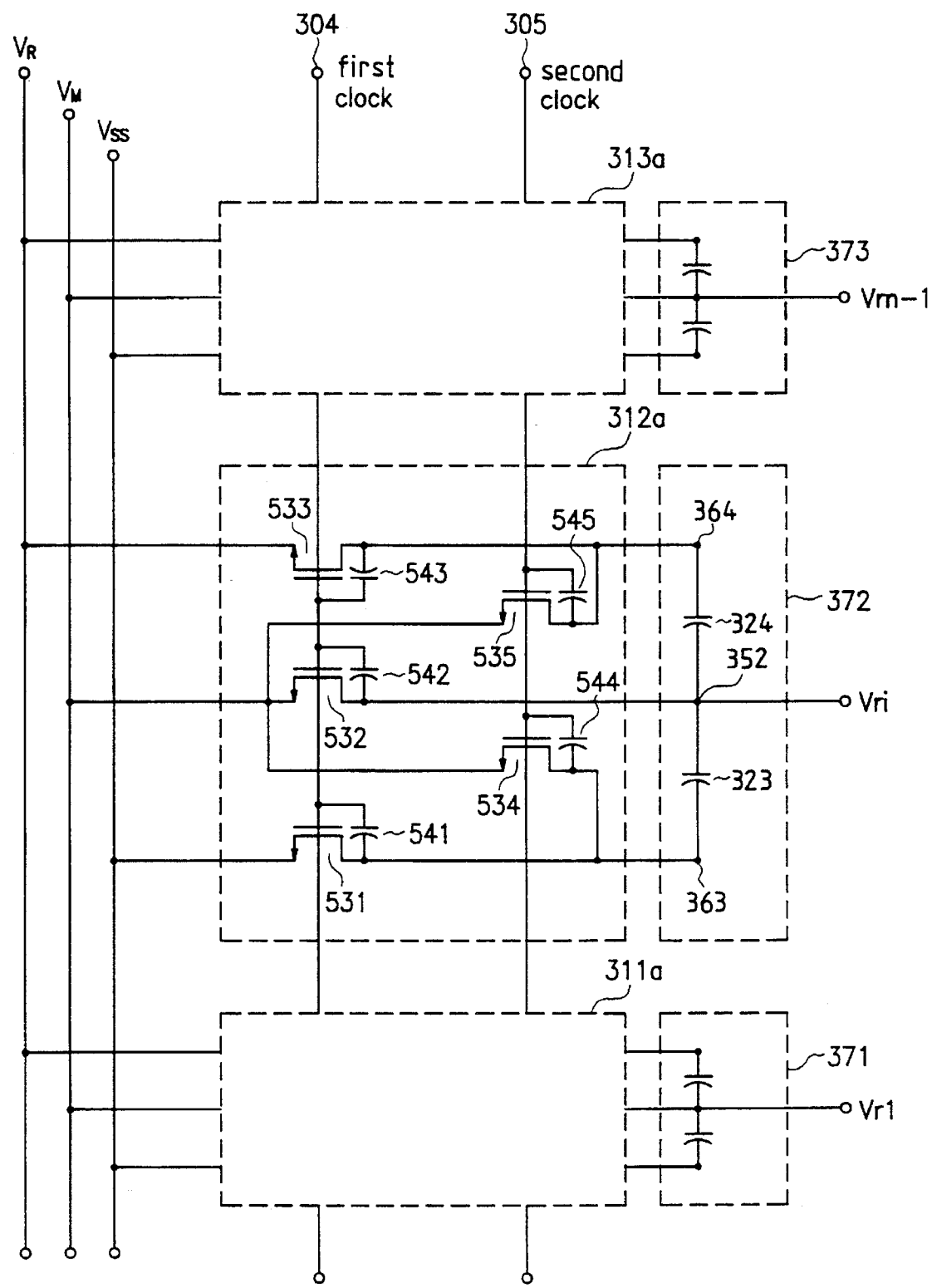
FIG. 7 is a circuit diagram showing the construction of the capacitor type voltage divider circuit according to a further embodiment of the present invention.

FIG. 7 shows the voltage divider circuit according to another embodiment of the present invention. The voltage divider circuit of FIG. 7 has the same construction as that of FIG. 5 except each detailed circuit structure of switching sections 311a, 312a, 313a. Component elements having similar functions to the component elements of the voltage divider circuit of the first embodiment (shown in FIG. 5) are indicated by the same reference numerals, and descriptions thereof are omitted.

In this embodiment, the voltage dividing, section 312a comprises five transistors and five parasitic capacitors.

As shown in FIG. 7, the source of a first transistor 531 is connected to the third reference voltage source $V_{SS}$, the gate thereof is connected to the first clock terminal 304 and the drain thereof is connected to the first node 363. The source of a second transistor 532 is connected to the second reference voltage source $V_M$, the gate thereof is connected to the first clock terminal 304, and the drain thereof to the output node 352. The source of a third transistor 533 is connected to the first reference voltage source $V_R$, the gate thereof is connected to the first clock terminal 304, and the drain thereof is connected to the second node 364. The source of a fourth transistor 534 is connected to the second reference voltage source $V_M$, the gate thereof is connected to the second clock terminal 305, and the drain thereof is connected to the first node 363. Also, the source of a fifth transistor 535 is connected to the second reference voltage source $V_M$, the gate thereof is connected to the second clock terminal 305, and the drain thereof is connected to the second node 364. Between the gate and drain of each transistors are connected the parasitic capacitors 541 to 545 respectively. In additional, the voltage dividing portion 372 has the same construction as that of FIG. 5, and description thereof is omitted.

Hereinafter, operation of the voltage divider circuit as shown in FIG. 7 will be described with reference to the waveform diagram of FIG. 8. In this embodiment, it is also assumed that the reference voltage signals are set to satisfy the condition of $V_R > V_M > V_{SS}$ in voltage level.

Figure 8:
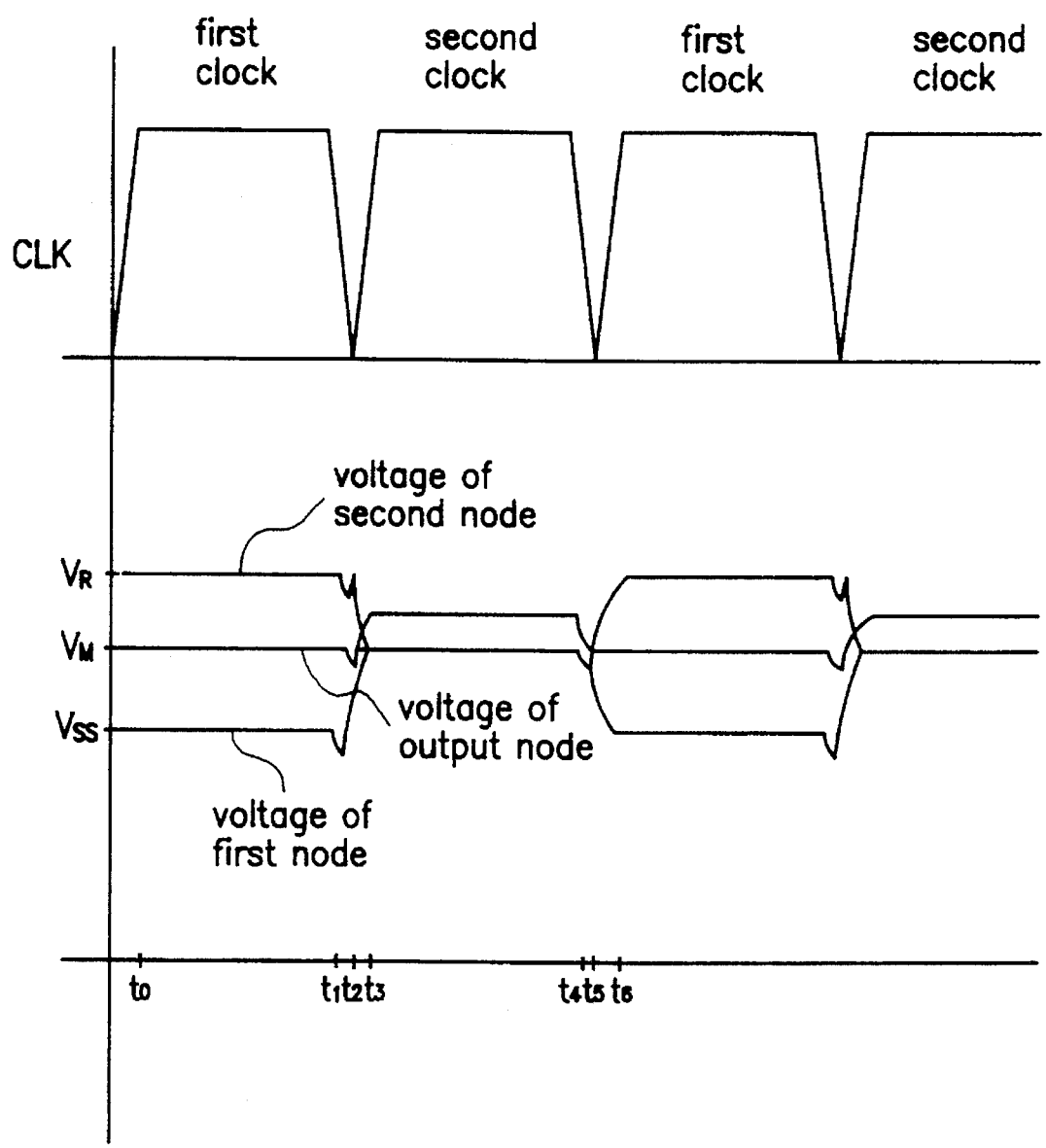
FIG. 8 is a timing diagram showing operation of the voltage divider circuit of FIG. 7.

As shown in FIG. 8, when a clock signal from the first clock terminal 305 is at the high level, i.e. during a time period of t0–t1, all the transistors 531 to 533 are conductive. Thus, the voltage of the second node 364 becomes the first reference voltage $V_R$ the, voltage of the output node 352 becomes the second reference voltage $V_M$, and voltage of the first node 363 becomes the third reference voltage $V_{SS}$. At this time, the voltage of the second reference voltage $V_M$ is subtracted by the third reference voltage $V_{SS}$ charged on the first capacitor 323, and the voltage of the first reference voltage $V_R$ is subtracted by the second reference voltage $V_M$ charged on the second capacitor, as shown in FIG. 8.

On the other hand, when the first clock signal becomes low level, i.e. during a time period of t1–t2, the transistors 531 to 533 are all not conductive and thereby each voltage of the nodes 352, 363, 364 is somewhat lowered by the parasitic capacitors 541 to 543.

During a time period of t2–t4, since the second clock signal becomes high level, the fourth and fifth transistors 534 and 535 are conductive. Then, since the first and second capacitors 323 and 324 are in parallel connection with each other, each voltage of the first and second nodes 363 and 364 is equal to the second reference voltage $V_M$ and the voltage Vri of the output node 352 can be expressed following equation:

$$Ci1(V_M - V_{SS}) + Ci2(V_M - V_R) = (Ci1 + Ci2) \times Vx \quad (5)$$

where Vx is a voltage between both ends of the two capacitors 323 and 324 connected in series, and Ci1 and Ci2 are the capacitance respectively of the capacitors 323 and 324.

From the equation (5), Vx can be calculated as follows:

$$Vx = [Ci1(V_M - V_{SS}) + Ci2(V_M - V_R)] / (Ci1 + Ci2) \quad (6)$$

In this equation (6), since $Vri = V_M + Vx$, the output voltage Vri can be given to following expression:

$$Vri = V_M + [Ci1(V_M - V_{SS}) + Ci2(V_M - V_R)] / (Ci1 + Ci2) \quad (7)$$

As seen from the equation, (14), the output voltage Vri having a desired level is obtained in accordance with change on each capacitance of the capacitors 323 and 324.

In the first and second embodiments, the voltage divider circuit can obtain a desired voltage using the capacitors, but has a problem that the output voltage is somewhat distorted by the parasitic capacitors in the switching section thereof.

Figure 9:
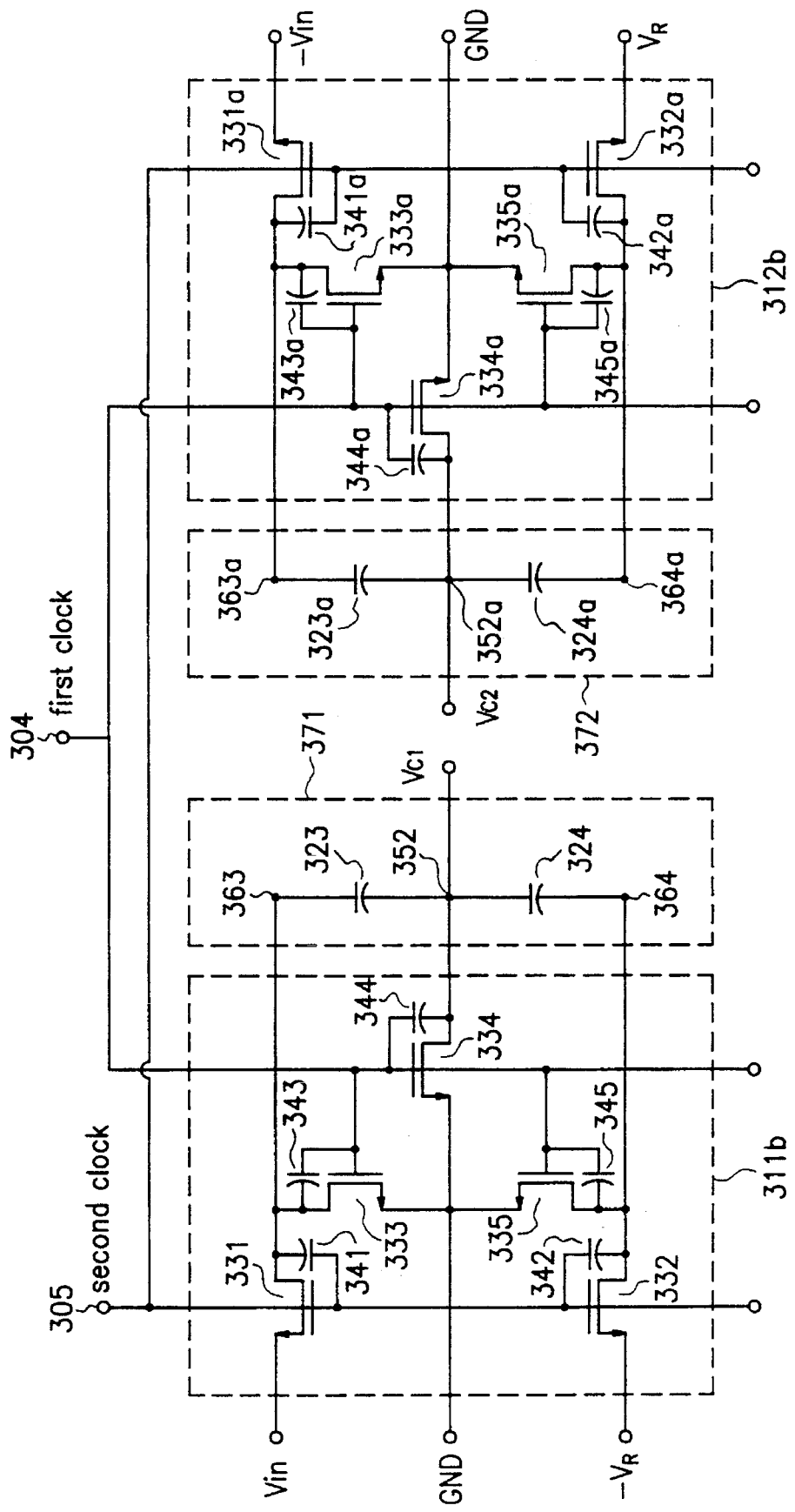
FIG. 9 is a circuit diagram showing the construction of the capacitor type voltage divider circuit according to another embodiment of the present invention.
Figure 11:
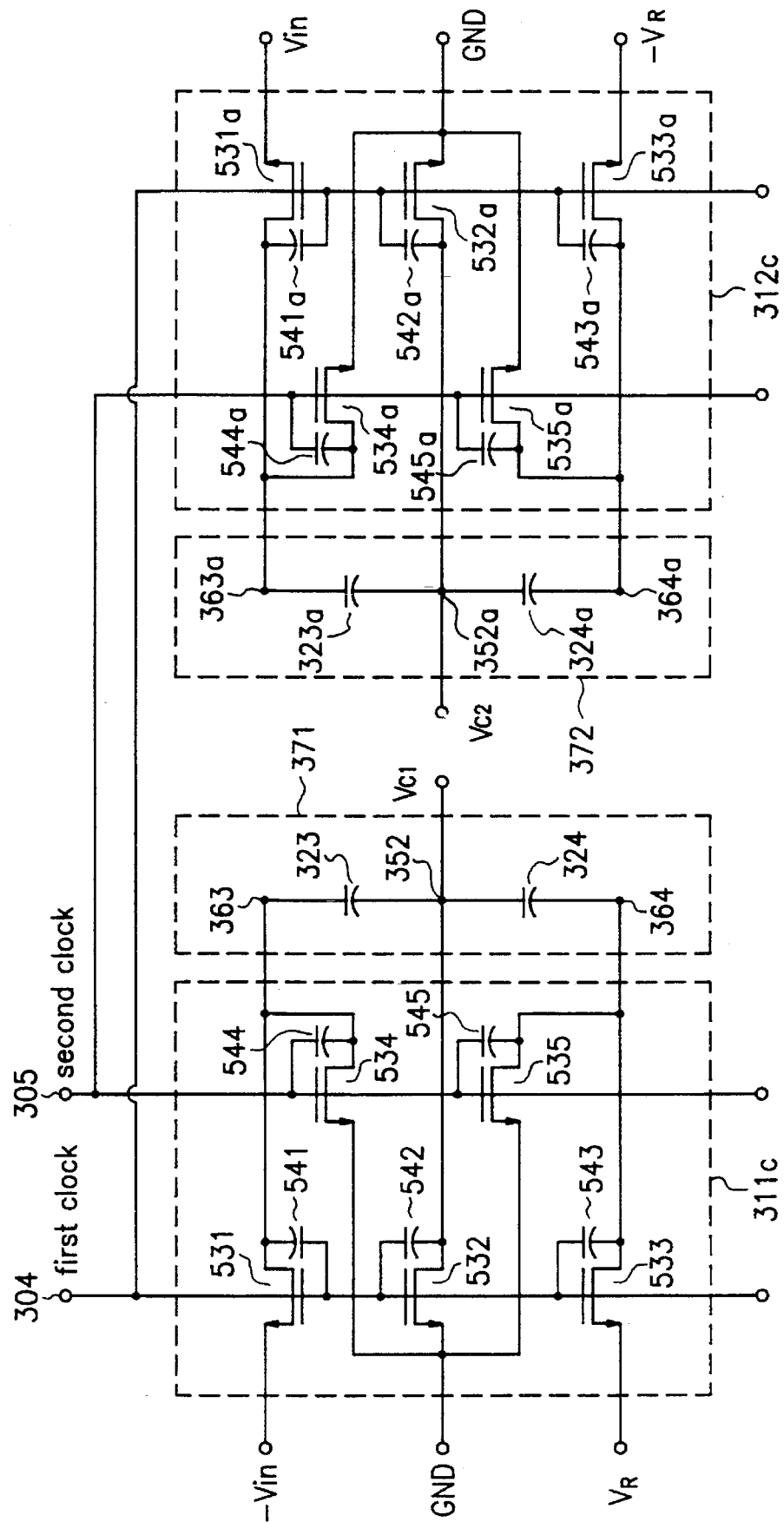
FIG. 11 is a circuit diagram showing the construction of the capacitor type voltage divider circuit according to an additional embodiment of the present invention.

Voltage divider circuits for eliminating distortion of the output voltage are shown in FIGS. 9 and 11.

FIG. 9 shows the voltage divider circuit according to a third embodiment of the present invention. The voltage divider circuit of FIG. 9 has the same construction as that of FIG. 5 except one switching section 313 and one voltage dividing section 373 are omitted in the circuit construction of FIG. 9. Component elements having similar functions to the component elements of the voltage divider circuit of the first embodiment (shown in FIG. 5) are indicated by the same reference numerals, and descriptions thereof are omitted.

In this embodiment, the voltage divider circuit has two switching sections 311b and 312b and two voltage dividing sections 371 and 372. Each of the switching sections 311b and 312b has the same construction as the switching section 311 of FIG. 5.

With reference to FIG. 9, a comparing voltage Vin in, place of the third reference voltage $V_{SS}$ of FIG. 5 is applied to the source of a first transistor 331 in the first switching section 311b, and an input voltage −Vin in place of the third reference voltage $V_{SS}$ of FIG. 5 is applied to the source of a first transistor 331a in the second switching section 312b. Ground signal GND in place of the second reference voltage $V_M$ of FIG. 5 is commonly applied to each source of transistors 334 and 334a in the switching sections 311b and, 312b, and reference voltage signals $-V_R$ and $V_R$ in place of the first reference voltage $V_R$ of FIG. 5 are applied to each source of transistors 332 and 332a in the switching portions 311b and 312b, respectively.

As shown in FIG. 9, since in the voltage divider circuit the two switching sections 311b and 312b are coupled in a differential structure, a voltage drop caused by parasitic capacitors therein can be prevented. This is because the same voltage errors in the output nodes 352, 352a are canceled from each other by a differential voltage (Vc1–Vc2).

Hereinafter, operation of the voltage divider circuit as shown in FIG. 9 will be described with reference to the waveform diagram of FIG. 10.

Figure 10:
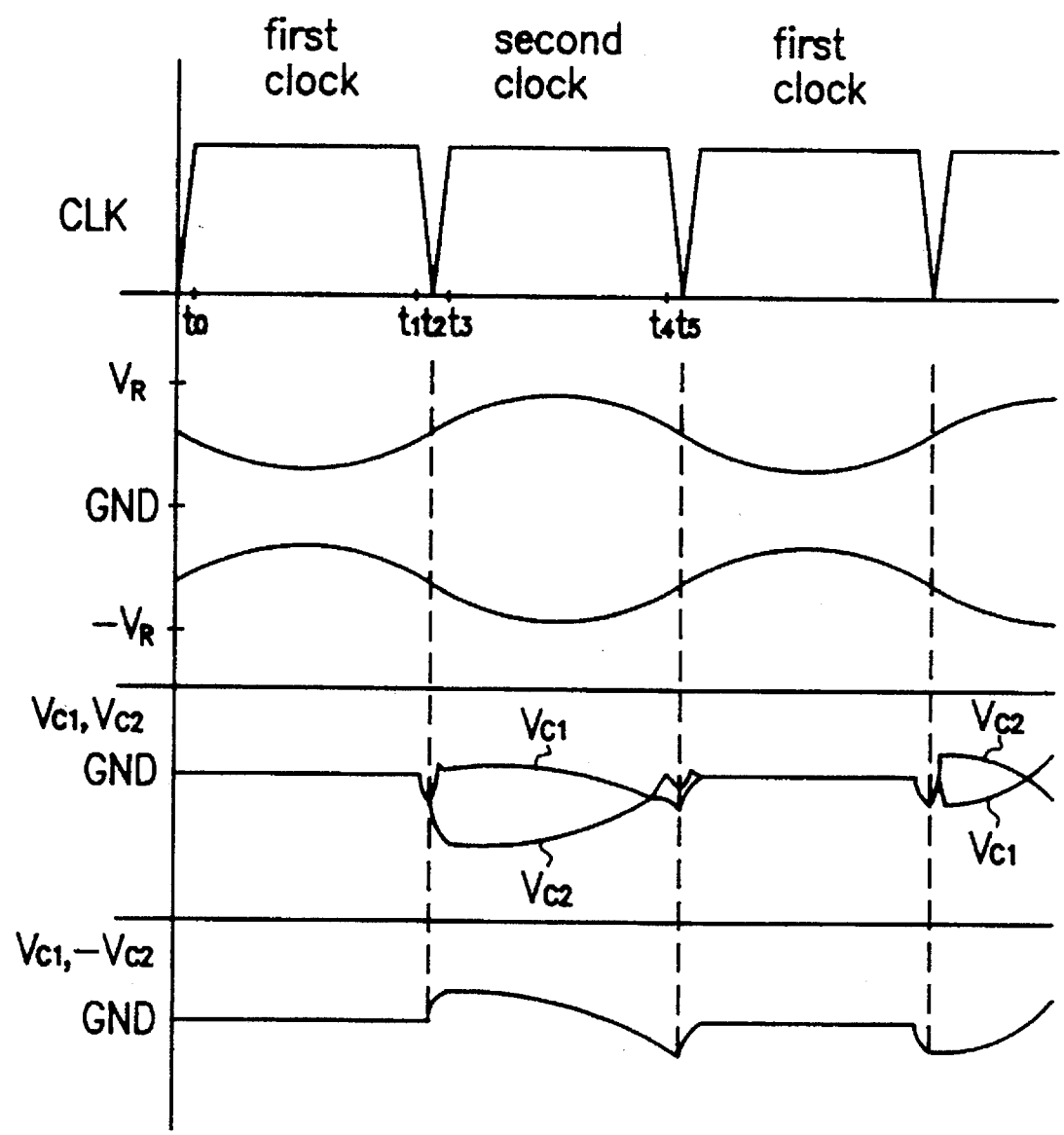
FIG. 10 is a timing diagram showing operation of the voltage divider circuit of FIG. 9.

As shown in FIG. 10, when a clock signal from the first clock terminal 304 is at the high level, i.e. during a time period of t0–t1, all the transistors 333 to 335 and 333a to 335a are conductive. Thus, each voltage of the nodes 352, 352a, 363, 364, 363a and 364a becomes equal to a ground voltage GND, and the difference voltage (Vc1–Vc2) also becomes equal to a ground voltage GND.

On the other hand, when the first clock signal becomes low level, i.e. during a time period of t1–t2, the transistors 333 to 335 and 333a to 335a all not conductive and thereby each output voltage Vc1 and Vc2 is somewhat lowered by the parasitic capacitors 343 to 345 and 343a to 345a. However, since load conditions of both the switching sections 311b and 312b are equal to each other, the switching portions 311b and 312b have the same voltage drop. As a result, the differential voltage is not varied.

During a time period of t2–t4, since the second clock signal becomes the high level, all the transistors 331, 332, 331a and 332a are conductive. Then, similarly to the voltage divider circuit of FIG. 5, the output voltage Vc1 has a value that a voltage between the input voltage Vin and the reference voltage −Vin is divided by two, and the output Vc2 has a value that a voltage between the input voltage −Vin and the reference voltage $V_R$ is divided by two. This relation can be given by following expression:

$$Vc1 = (Vin \times C1 - V_R \times C2)/(C1+C2) - \Delta V \quad (8)$$

$$Vc2 = V_R \times C4 - Vin \times C3)/(C3+C4) - \Delta V \quad (9)$$

where C1, C2, C3 and C4 are the capacitance of the capacitors 323, 324, 323a and 324a respectively of FIG. 9 and, $\Delta V$ is an output voltage dropped by parasitic capacitors.

In the equations, (8) and (9), if C1=C3 and C2=C4, the differential voltage Vc1–Vc2 can be obtained by following equation:

$$Vc1 - Vc2 = 2(Vin \times C1 - V_R \times C2)/(C1+C2) \quad (10)$$

As seen from the equation, (10), each voltage drop caused by he parasitic capacitors can be canceled, and the input voltage Vin can be compared whether it is less than or more than ($V_R \times C2/C1$). Also, a reference value can be changed in accordance with a capacitance of the capacitors C1 and C2.

FIG. 11 shows a modification of the voltage divider circuit of the third embodiment as shown in FIG. 9. The voltage divider circuit of FIG. 11 has the same construction as that of FIG. 7 except one switching section 313a and one voltage dividing section 373 are omitted in the circuit construction of FIG. 7. Component elements having similar functions to the component elements of the voltage divider circuit of the first embodiment (shown in FIG. 7) are indicated by the same reference numerals, and descriptions thereof are omitted.

In this embodiment, the voltage divider circuit has two switching sections 311c and 312c and two voltage dividing portions 371 and 372. Each of the switching sections 311c and 312c has the same construction as the switching portion 312a of FIG. 7.

Similar to the circuit of FIG. 9, the voltage divider circuit of FIG. 11 has two switching sections 311c and 312c coupled in a differential configuration. Therefore, the circuit of FIG. 11 also can minimize variation of an output voltage caused by parasitic capacitors therein. Variation in the output voltage of the circuit is caused every time each transistor of the switching portion is switched.

With reference to FIG. 11, a comparing voltage Vin is applied to the source of transistor 531a in the switching section 312c, and an input voltage −Vin is applied to the source of the transistor 531 in the switching section 311c. To each source of transistors 532, 532a in the switching sections 311c and 312c a ground voltage GND is applied, and to a source of a transistor 533 in the switching section 311c a reference voltage $V_R$ is applied. To a source of a transistor 533a in the switching section 312c a reference voltage $-V_R$ is applied.

Also, a first clock terminal 304 is commonly connected to each gate of the transistors 531 to 533 in the switching section 311c, and the sources of the transistors 531 to 533 are connected to −VN, GND, $V_R$, respectively. A second clock terminal 305 is commonly connected to each gate of the transistors 534 and 535, GND is connected each source thereof, and nodes 363 and 364 are respectively connected to the drains thereof. Between the gate and drain of each of the transistors 531 to 535, parasitic capacitors 541 to 545 are connected, respectively. First capacitor 323 is connected between nodes 352 and 363 and a second capacitor 324 is connected between nodes 352 and 364. The switching section 312c has the same construction as that of the switching section 311c, and the voltage dividing section 371 also has the same construction as that of the voltage dividing section 372.

Hereinafter, operation of the voltage divider circuit as shown in FIG. 11 will be described with reference to the waveform diagram of FIG. 12.

Figure 12:
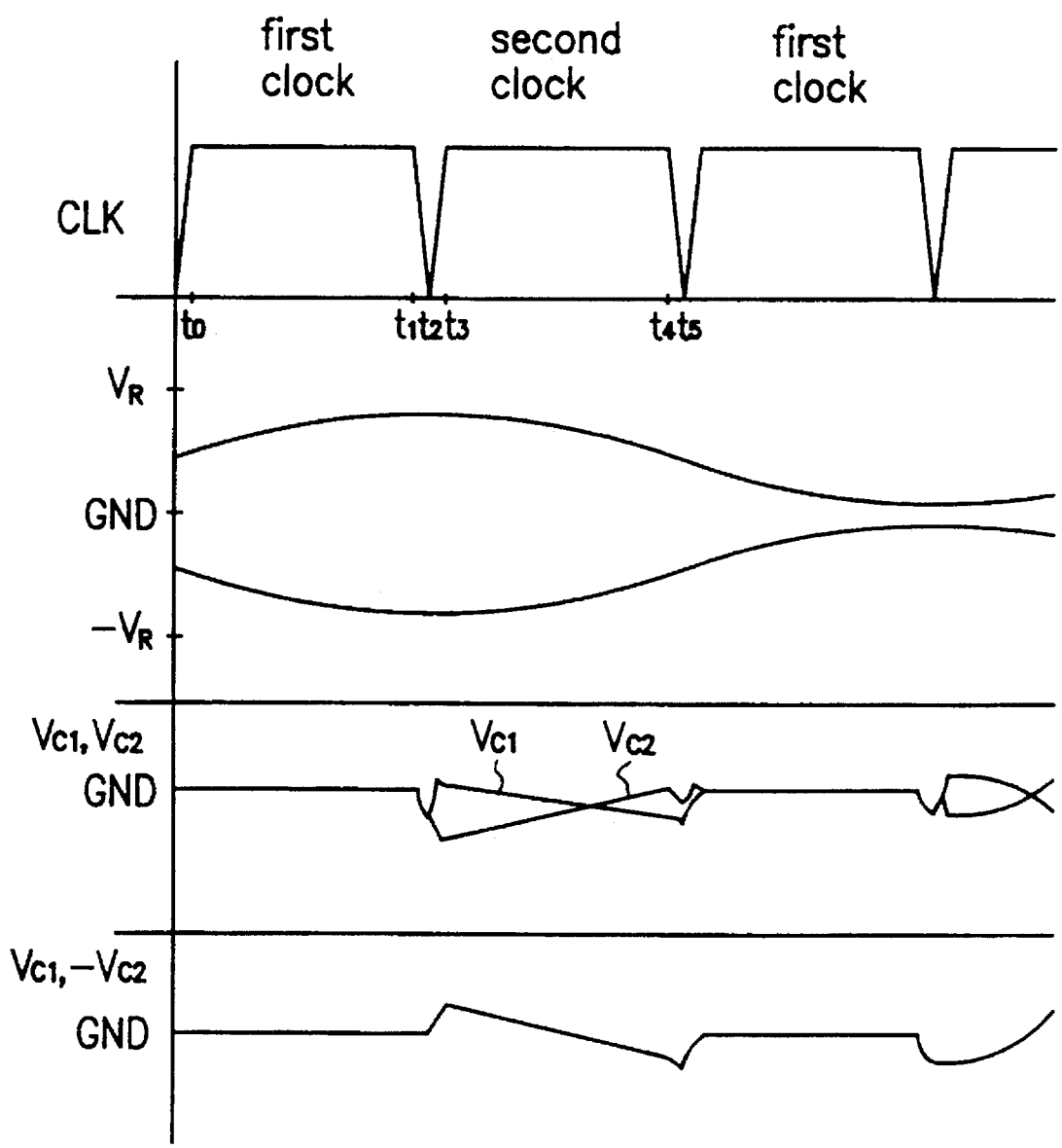
FIG. 12 is a timing diagram showing operation of the voltage divider circuit of FIG. 11.

As shown in FIG. 12, when a clock signal from the first clock terminal 304 is at the high level, i.e. during a time period of t0–t1, all the transistors 531 to 533 and 531a to 533a are conductive. Thus, the voltage of each the output nodes 352, 352a becomes equal to a ground voltage GND. The first and second capacitors 323 and 324 are charged to −Vin, $V_R$, respectively, and the third and fourth capacitors 323a and 324a are charged to Vin and $-V_R$, respectively.

On the other hand, when the first clock signal becomes the low level, i.e. during a time period of t1–t2, the transistors 591 to 533 and 531a to 533a are all not conductive and thereby each output voltage Vc1 and Vc2 is somewhat dropped by the parasitic capacitors 541 to 543 and 541a to 543a. However, an amount of this voltage drop is not equal in the output nodes 352 and 352a. This is because voltage levels to be applied to the transistors 531, 533, 531a and 533a are different from one another. Error caused by this voltage drop can be largely reduced by using a pair of PMOS and NMOS transistors as a switching element.

During a time period of t2–t4, since the second clock signal becomes the high level, the voltage signals charged on each capacitors 323, 324, 323a and 324a are divided by two. The output divided voltage signals Vc1 and Vc2 thus can be obtained by following equation:

$$Vc1=(Vin \times C1 - V_R \times C2)/(C1+C2) - \Delta V1 \quad (11)$$

$$Vc2=(-Vin \times C3 + V_R \times C4)/(C3+C4) - \Delta V2 \quad (12)$$

where ΔV1 is amount of a voltage drop of Vc1 caused by parasitic capacitors and ΔV2 is amount of a voltage drop of Vc2 caused by parasitic capacitors.

If C1=C3 and C2=C4, a differential voltage of (Vc1−Vc2) can be obtained by following expression:

$$Vc1-Vc2=2(Vin \times C1 - V_R \times C2)/(C1+C2) - (\Delta V1 - \Delta V2) \quad (13)$$

As seen from the equation (13), an effect caused by an absolute error can be canceled because the output voltage signals ΔV1 and ΔV2 caused by a parasitic effect are canceled from each other.

According to the present invention, the voltage divider circuit has several advantages:

First, since a current signal for charging and discharging capacitors of a voltage dividing portion flows only when a clock signal is changed, a current consumption can be minimized. For example, if a voltage signal V having a frequency f1 is charged and discharged continuously. in a capacitor having a capacitance C, an average current signal Iav flowing through the capacitor C is expressed as follows:

$$Iav = C \times V \times f1 \quad (14)$$

As seen from the equation (14), a current consumption can be reduced by minimization of C, V and the frequency f1.

In addition, capacitors can be easily matched in comparison with resistors. A relative error of capacitance values is approximately 0.06%, and thus a matching accuracy of a capacitor can be obtained more higher than that of a resistor. Therefore, using the capacitor type voltage divider circuit according to the present invention, low power and high accuracy can be obtained.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A capacitor type voltage divider circuit comprising:

a source of a plurality of reference voltage signals;

a plurality of switching means, coupled to the source, for switching the reference voltage signals applied thereto in response to first and second clock signals; and a plurality of voltage dividing means each having two capacitors for dividing the reference voltage signals provided from the switching means into a predetermined value; and wherein said switching means each comprise first and second transistors switched in response to the second clock signal, third, fourth and fifth transistors switched in response to the first clock signal, and a plurality of parasitic capacitors connected between a gate and a drain of each of the transistors with one reference voltage signal of the reference voltage signals being connected to a source of the first transistor, another reference voltage signal being connected to a source of the second transistor, and an additional reference voltage signal of the reference voltage signals being commonly connected to a source of the third, fourth and fifth transistors.

2. The voltage divider circuit as defined in claim 1, wherein:

each of said voltage dividing means comprises two capacitors coupled together to produce an output voltage Vri defined by the equation $$Vri=(V_R \times Ci2 + V_{SS} \times Ci1)/(Ci1+Ci2)$$

where $V_R$ and $V_{SS}$ are the another and the one reference voltage signals, respectively, and Ci1 and Ci2 are each a capacitance of the two capacitors, respectively.

3. A capacitor type voltage divider circuit comprising:

a source of a plurality of reference voltage signals;

two switching means, coupled to the source, for switching the plurality of reference voltage signals in response to first and second clock signals; and two dividing means configured in a differential configuration and each having two capacitors coupled together for dividing the switched plurality of reference voltage signals provided from the switching means into a predetermined value; and wherein the two dividing means each output voltage signals Vc1 and Vc2 and a differential output voltage Vc1–Vc2 defined by the equations $$Vc1=(Vin \times C1 - V_R \times C2)/(C1+C2) - \Delta V$$

$$Vc2=(V_R \times C4 - Vin \times C3)/(C3+C4) - \Delta V$$

$$Vc1-Vc2=2(Vin \times C1 - V_R \times C2)/(C1+C2)$$

wherein C1 and C2 are the capacitance of the two capacitors in one of the two dividing means, respectively, C3 and C4 are the capacitance of the two capacitors in another of the two dividing means, respectively, $\Delta V$ is a voltage drop caused by parasitic capacitors in the circuit, and Vin and $V_R$ are an input voltage and a reference voltage of the reference voltage signals, respectively.

4. The voltage divider circuit as defined in claim 3, wherein:

one of the two dividing means has an output voltage Vri defined by the equation $$Vri=V_M+[C1(V_M-V_{SS})+C2(V_M-V_R)]/(C1+C2)$$

where $V_R$, $V_M$ and $V_{SS}$ are first, second and third reference voltage signals of the reference voltage signals, and C1 and C2 are the capacitance of the two capacitors of the one dividing means; and another of the two dividing means has an output voltage Vri defined by the equation $$Vri=V_M[C3(V_M-V_{SS})+C3(V_M-V_R)]/(C3+C4)$$

where C3 and C4 are the capacitance of the two capacitors of the another of the dividing means.

5. A capacitor type voltage divider circuit comprising:

a source of a plurality of reference voltage signals;

two switching means, coupled to the source, for switching the plurality of reference voltage signals in response to first and second clock signals; and two dividing means being configured in a differential configuration and each having two capacitors coupled together for dividing the switched plurality of reference voltage signals provided from the switching means into a predetermined value; and wherein the two dividing means each output voltage signals Vc1 and Vc2 and a differential output voltage Vc1–Vc2 defined by the following equations $$Vc1=(Vin \times C1 - V_R \times C2)/(C1+C2) - \Delta V1$$

$$Vc2=(-Vin \times C3 + V_R \times C4)/(C3+C4) - \Delta V2$$

$$Vc1-Vc2=2(Vin \times C1 - V_R \times C2)/(C1+C2)-(\Delta V1 - \Delta V2)$$

wherein Vin and $V_R$ are an input voltage and a reference voltage, and $\Delta V1$ and $\Delta V2$ are respectively voltage drops caused by parasitic capacitors in the two dividing means.

* * * * *